(12) United States Patent
Kuffner

(10) Patent No.: US 7,212,789 B2
(45) Date of Patent: May 1, 2007

(54) TUNABLE DUPLEXER

(75) Inventor: Stephen L. Kuffner, Algonquin, IL (US)

(73) Assignee: Motorola, Inc., Schaumbrg, IL (US)

( * ) Notice: Subject to any disclaimer, the term of this patent is extended or adjusted under 35 U.S.C. 154(b) by 468 days.

(21) Appl. No.: 10/334,100

(22) Filed: Dec. 30, 2002

(65) Prior Publication Data

US 2004/0127178 A1 Jul. 1, 2004

(51) Int. Cl.
*H04B 1/44* (2006.01)

(52) U.S. Cl. .................. 455/83; 455/87; 455/276.1; 455/277.2; 455/275; 455/78; 455/82; 455/133; 333/124; 333/126; 333/129

(58) Field of Classification Search ................ 455/133, 455/276.1, 275, 277.2, 78, 82, 86, 87, 83, 455/118

See application file for complete search history.

(56) References Cited

U.S. PATENT DOCUMENTS

| | | | | | |
|---|---|---|---|---|---|
| 5,126,700 | A | * | 6/1992 | Curtin et al. | 333/16 |
| 5,267,297 | A | * | 11/1993 | Kawano et al. | 455/561 |
| 5,369,782 | A | * | 11/1994 | Kawano et al. | 455/16 |
| 5,437,055 | A | * | 7/1995 | Wheatley, III | 455/429 |
| 5,488,335 | A | * | 1/1996 | Agahi-Kesheh et al. | 333/206 |
| 5,502,749 | A | * | 3/1996 | Ozaki | 375/368 |
| 5,577,265 | A | * | 11/1996 | Wheatley, III | 370/335 |
| 5,590,411 | A | * | 12/1996 | Sroka et al. | 455/78 |
| 5,694,093 | A | * | 12/1997 | DaSilva et al. | 332/103 |
| 5,822,684 | A | * | 10/1998 | Kitakubo | 455/78 |
| 5,963,856 | A | * | 10/1999 | Kim | 455/307 |
| 6,249,249 | B1 | * | 6/2001 | Obayashi et al. | 342/371 |
| 6,262,637 | B1 | * | 7/2001 | Bradley et al. | 333/133 |
| 6,308,051 | B1 | * | 10/2001 | Atokawa | 455/78 |
| 6,313,713 | B1 | * | 11/2001 | Ho et al. | 333/1.1 |
| 6,384,680 | B1 | * | 5/2002 | Takei et al. | 330/124 R |
| 6,472,952 | B1 | * | 10/2002 | Sakai et al. | 333/126 |
| 6,507,733 | B1 | * | 1/2003 | Krupezevic et al. | 455/324 |
| 6,525,624 | B1 | * | 2/2003 | Hikita et al. | 333/133 |
| 6,567,649 | B2 | * | 5/2003 | Souissi | 455/83 |
| 6,603,391 | B1 | * | 8/2003 | Greeff et al. | 340/10.3 |
| 6,625,436 | B1 | * | 9/2003 | Tolson et al. | 455/334 |
| 6,653,912 | B2 | * | 11/2003 | Robinson et al. | 333/132 |
| 6,714,098 | B2 | * | 3/2004 | Nishida et al. | 333/133 |

* cited by examiner

*Primary Examiner*—Marceau Milord
(74) *Attorney, Agent, or Firm*—Cardinal Law Group; Lawrence J. Chapa

(57) ABSTRACT

The method and apparatus herein identifies tunable duplexer in a communication system. The tunable duplexer includes a tunable receiver filter, a tunable transmitter filter, a variable receiver phase shifter, and variable transmitter phase shifter. Each filter and phase shifter is optimized based on characteristics of impedance within the duplexer. The duplexer may be adjusted to changing environments or desired changes in the frequency of operation, reducing circuitry architecture and providing greater flexibility in communication function. The method commences by tuning tunable filters within the duplexer and then optimizing phase shifters within the duplexer for adjusting impedance matching with antenna and isolating the receiver from the transmitter during duplexing operations. Optimizations and calibration may be performed during manufacture, upon initialization of the system, or during operation of the communication device. The modes of calibration and operation may be generalized as "predefined" (for known environments and frequencies) or "adapt," where antenna impedance or frequency of operation changes.

33 Claims, 4 Drawing Sheets

TUNABLE DUPLEXER

FIELD OF THE INVENTION

The present invention relates to duplexer devices and a method for using and calibrating same and, more particularly, to a tunable duplexer device that is capable of adjusting impedance matching for multiple bands being suitable for use in portable and stationary communication devices and systems for transmitting and receiving signals to and from a common antenna.

BACKGROUND OF THE INVENTION

In communication devices, duplexers functionally provide the ability to receive and transmit signals while utilizing the same antenna. In usual transmission operations of a communication system, audio signals, which are typically fed into a microphone, are converted to a modulated signal by a modulator that is then converted to a designated carrier frequency by an oscillator. Thereafter, the signal passes through an interstage filter, which selects only a signal having a desired transmission frequency, and is then amplified to the desired signal intensity by a power amplifier, the output of which is fed to an antenna duplexer. The antenna duplexer passes only the signals of the designated transmission frequency to the antenna, which transmits the signal as a radio signal into the air.

In receiving operations, a signal received by the antenna is transmitted to the antenna duplexer to select only a signal of a designated frequency. The selected signal is generally amplified by a low-noise amplifier and transmitted through a signal converter where only a desired characteristic or signal is selected by filters within the signal converter. The signal is down-converted to baseband and then manipulated as an audio signal. An antenna duplexer is usually positioned between the antenna and down-converter circuits and has such a function that the transmission signal and the reception signal are isolated to prevent interference between the two types of signals.

Electrically a duplexer is a device using distinctly tuned resonant circuits to isolate a transmitter from the receiver, allowing the transmitter and the receiver to operate on the same antenna at the same time without the transmitter adversely affecting the receiver. Duplexers use filters, such as various pass band filters and notches to accomplish isolation and continuity in signal transfer. In duplexer operation, filters must pass the desired signal while rejecting as much as possible of the undesired signals. For example, all of the transmitter's energy is not contained in just the desired frequency; transmitters characteristically generate a wide band noise for a considerable width around the center frequency. Therefore, a reject band [or notch] filter may be used to refine the signal within the device. Within the art, a combination of complex or simple filters may be used to obtain the desired performance of the communication device.

The antenna duplexer necessarily has at least a transmission filter and a reception filter, and in order to prevent interaction between the transmission filter and the reception filter, it also has a matching circuit, which is also referred to as a phase matching circuit or a line pattern for phase matching. While an antenna operates as an interface between circuits and space, which transfers power between space and the transmitter (Tx) or receiver (Rx), its impedance acts as the load for the Tx or the input impedance for the Rx. This impedance is determined by such factors as electrical properties or environmental properties (e.g. surrounding conducting or insulating objects), generally categorized as ohmic resistance and radiation resistance but is also partially manifested as reactance. As with all devices that transfer energy, an antenna correspondingly has efficiency associated with its operation, namely, the measurement of the dissipated power within the antenna due to ohmic resistance of the antenna conductor and other losses. Optimized impedance matching to the antenna maximizes the power transferred between space and circuits.

Within the design of communication devices, computer simulations, tedious manual computations, or Smith Charts may be utilized to perform impedance matching. Manual computations typically involve complex conjugate calculations and numerous equations. Computer simulations are typically dedicated to design functions and not impedance matching. Such simulations require designer familiarity with multiple data inputs and their associated correct formats, and understanding voluminous results data. Smith Charts, or simulations that incorporate Smith Charts, are not only used for finding matching networks component values or maximum power transfer but are also used with such design tasks as optimizing for the best noise figures, ensuring quality factor impact, and assessing stability analysis.

In addition to the generalization of duplexer complexities, recent development of the mobile phone has resulted in the expansion of diverse functionality in communication devices that further complicates duplexer design. For example, increased device functions such as dual mode (e.g., a combination of an analog mode and a digital mode, or a combination of digital modes, such as TDMA (time division multiple access) or CDMA (code division multiple access)), and a dual band (e.g., a combination of an 800 MHz band and a 1.9 GHz band, or a combination of a 900 MHz band and a 1.8 GHz band or a 1.5 GHz band) have been increasing the complexity of device architecture and circuitry. Increased implementation of frequency related functions affect antenna bandwidth. Antenna bandwidth is generally the range of frequencies over which the antenna can operate while some other characteristic remains in a given range. Therefore, increased frequency ranges increases demand for performance over a number of frequency channels, or a wide bandwidth antenna. Moreover, to support these multiple, diverse functions while maintaining proper isolation and reliable signal transfer between Tx and Rx operations, present communication devices use fixed, redundant circuitry, such as an increased quantity of switches and filters to compensate and broaden duplexer capabilities. Accordingly, such increased use and quantity of filters synergistically creates the need for optimizing filter performance.

Ubiquitous to the electronics field and universal to the communications field is the continuing demand for component reduction and high performance devices. Elimination of redundant components, functions, or circuitry is highly desired in communication electronics. Similarly desired is increased performance in communication devices without increasing device size, weight, or price. Within the field, these individual design factors [goals] are frequently pursued independently while balancing impacts to other factors. Common within the field is the optimization of one factor, such as device performance, while maintaining or suboptimizing another factor, such as redundant components.

Although frequency ranges of the communication system often determine the type of technology used in device design (e.g., MEMS (Micro-Electro-Mechanical Systems)), prospective uses of the radio frequency spectrum are driving the need for higher performance devices with reduced circuitry/ architecture. For example, the FCC sanctioned "cognitive radio" purports to use non-assigned spectrum based on the condition that there be no present, real-time use occurring. This projected use imports future designs and concepts that are time-based with an increased number of bands—further demanding higher performance and greater architecture.

Given the aforementioned duplexer issues, tunable duplexers provide a form of alternate solutions. Present tunable duplexer designs and techniques incorporate one of two approaches: (1) using multiple filters for increased demand in bandwidth on each side of circuitry, i.e., for the Tx side and one for the Rx side, or (2) incorporating the use of a circulator, a bulky three port device for directional management and isolation. However, these schemes have proven limitations in today's communications field. For example, the use of multiple filters frequently incorporated the use of switched filters and substantially increased the amount of circuitry needed to accomplish functionality. This design approach also makes for difficult or clumsy impedance matching and performance solutions with either multi-throw switches or cascaded lower throw switches, in addition to the multiple filters. This approach is in conflict with the goal of optimizing filter performance. For the second approach, circulators are big, heavy, and are typically narrow band components, which use magnets for appropriate biasing. Additionally, broader band applications or needs result in larger componentry (e.g., circulator matching, support circuitry, etc.). Also, isolation capabilities within circulators are limited. Therefore, if not properly aligned, circulators adversely effect the optimization of filters.

In general, obstacles encountered by present day duplexers include, but are not limited to, impedance matching, reliable and quality signal transfer, and complex or cumbersome filter designs to support increase functional demand and Tx-Rx isolation. Moreover, fixed filter designs are commonly used to sustain multiple bands. In the situations where tunable duplexers are used, present methods or designs are ineffective.

It is desirable, therefore, to provide a system and method that overcomes these and other disadvantages.

SUMMARY OF THE INVENTION

The present invention includes a tunable duplexer and method for using and calibrating the same. The tunable duplexer includes a tunable receiver filter, a tunable transmitter filter, a variable receiver phase shifter, and variable transmitter phase shifter. The tunable filters are operably connected to their corresponding phase shifter and transmitter/receiver. The phase shifters are operably connected to the antenna and provide additional impedance matching and circuitry isolation.

The tunable filters are optimized and tuned according to an initial frequency of operation and temperature. Tuning values for the filters are determined for desired bands or frequencies of operations. The filters may be individually and externally tuned or tuned in a duplexer environment where characteristic impedance is present among the phase shifters, antenna, receiver, and transmitter. Phase shifters are optimized and tuned based on analysis of the impedance characteristics and reflection coefficients within the duplexer, which includes the filters. Multiple tuning values may be generated and recorded for the filters and shifters, and such values may be paired, recorded and retrieved for subsequent duplexer tuning utilization. Random or gradient methods of optimization may be used to tune the filters and phase shifters.

The duplexer may be adjusted to changing environments or desired changes in the frequency of operation, reducing circuitry architecture and providing greater flexibility in communication function. The method commences by tuning tunable filters within the duplexer and then optimizing phase shifters within the duplexer for adjusting impedance matching with antenna and isolating the receiver from the transmitter during duplexing operations. Phase shifter may be tuned based on reflection coefficients or other impedance parameters by isolating one side of the communication system (transmit or receive) and seeking the best filter return loss over the frequency of interest or operation. Optimizations and calibrations may be performed during manufacture, upon initialization of the system, or during operation of the communication device. The modes of calibration and operation may be generalized as predefined (for known environments and frequencies) or adapting, where antenna impedance or frequency of operation changes.

The foregoing and other features and advantages of the invention will become further apparent from the following detailed description of the presently preferred embodiments, read in conjunction with the accompanying drawings. The detailed description and drawings are merely illustrative of the invention rather than limiting, the scope of the invention being defined by the appended claims and equivalents thereof.

DETAILED DESCRIPTION OF THE DRAWINGS

Figure 1:
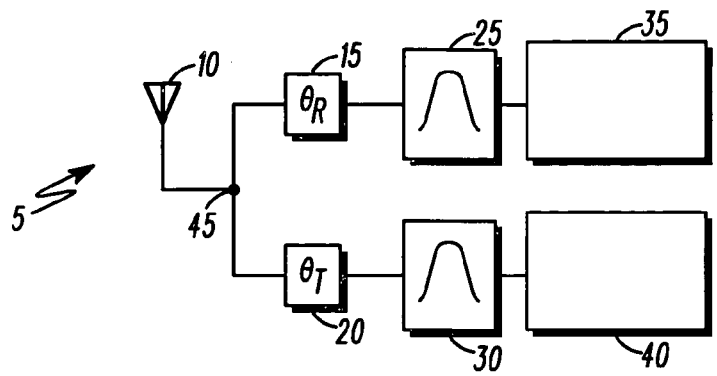
FIG. 1 is a high-level block diagram of the tunable duplexer incorporating an embodiment of the present invention.

FIG. 1 illustrates high-level block diagram architecture of one embodiment of a tunable duplexer 5, according to the present invention. Antenna 10 is operably connected to a receiver 35 via a receiver variable phase shifters 15 and a tunable receiver filter 25. Similarly, antenna 10 is also connected to a transmitter 40 via a transmitter variable phase shifters 20 and a tunable transmitter filter 30. Receiver 35 may include all circuitry associated with the receiver side of a communication system. Typically, the receiver circuitry may include, but is not limited to, a low noise amplifier, a down converter, an intermediate frequency filter and amplifier, an in-phase/quadrature down converter, A/D converters, and the receiver digital processing. Similarly on the transmitter side of operation, transmitter 40 may include all circuitry components associated with the transmitter side of a communication system. Such components may include, a power amplifier, interstage filters, the up-converter, local oscillators, baseband anti-aliasing filters, D/A converters, and the transmitter digital signal processing.

Tunable duplexer 5 also includes common node 45. As discussed, the impedance of the antenna and filters are properly matched for efficiency during operation, which is required during both transmit (Tx) and receive (Rx) operations. Within duplexer design, proper impedance matching must occur via the filters at the common node 45 so as not to detrimentally terminate the two sides' passbands, since changes in temperature and frequency adversely affect efficient performance of the antenna 10 and the duplexer 5. Tunable duplexer 5 further includes tunable filters 25 and 30 that assist in avoiding termination of the filter passbands. Also, within the present embodiment, variable phase shifters 15 and 20, are implemented to optimize the duplexer common node interconnect 45.

Figure 2:
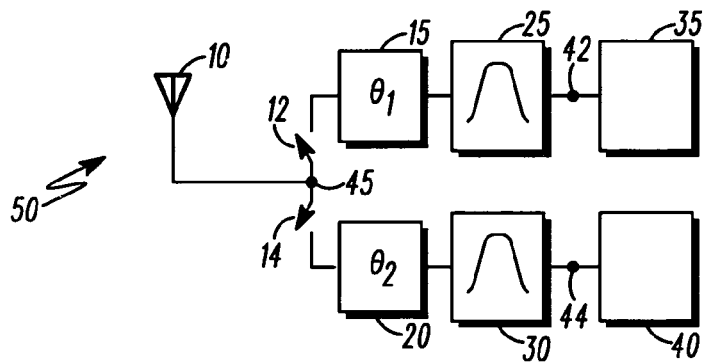
FIG. 2 is a block diagram of the tunable duplexer as an alternate embodiment of FIG. 1.

FIG. 2 illustrates an alternative embodiment of a tunable duplexer 50. In FIG. 2, an alternate embodiment splits the antenna via two switches 12 and 14 to configure the duplexer in three modes of operation: receive only, transmit only, or full duplex. Modes are dependent on the state of the switches 12 and 14. Switches 12 and 14 may be single pole, single throw (SPST) or any combination of switching features that controls the Tx, Rx, or duplexing functions of the duplexer 50. For non-simultaneous Tx/Rx functions, the two tunable filters 25 and 30 may even be tuned to the same frequency without detrimental impact (if desired), since the switches 12 and 14 provide isolation of the Tx and Rx side of the communication system. In addition to providing isolation, tunable duplexer 50 allows application to time (e.g. 802.11b, Bluetooth), frequency (e.g. CDMA, WCDMA), or time-and-frequency duplexed (e.g. GSM) systems.

Variable phase shifters 15 and 20 allow for proper rotation of the impedances (when considering the impedance as a phasor with magnitude and phase components) to a desired or pre-determined tuning. For a predetermined filter tuning combination, predetermined phase settings could be used. For new tuning combinations, or in the case where the antenna impedance has changed, the tunable phase shifters 15 and 20 adapt the impedance presented at the common node to optimize the system. For the band pass portion of a frequency response, a phase shifter 15 or 20 only presents a phase shift to the incoming signal with some minimal insertion loss, with such a loss being tolerable in most communication systems. By way of example, for stop-band impedances, the phase will be rotated by twice the phase shift through the phase shifter 15 or 20. Such a phase rotation will still present a large reflection coefficient to the antenna (using a Smith Chart); but at a phase that is more optimum for the application (e.g., rotating the impedance around from some finite reactance to a parallel open circuit at the common node, 45, which will not load the remaining circuitry).

Figure 3:
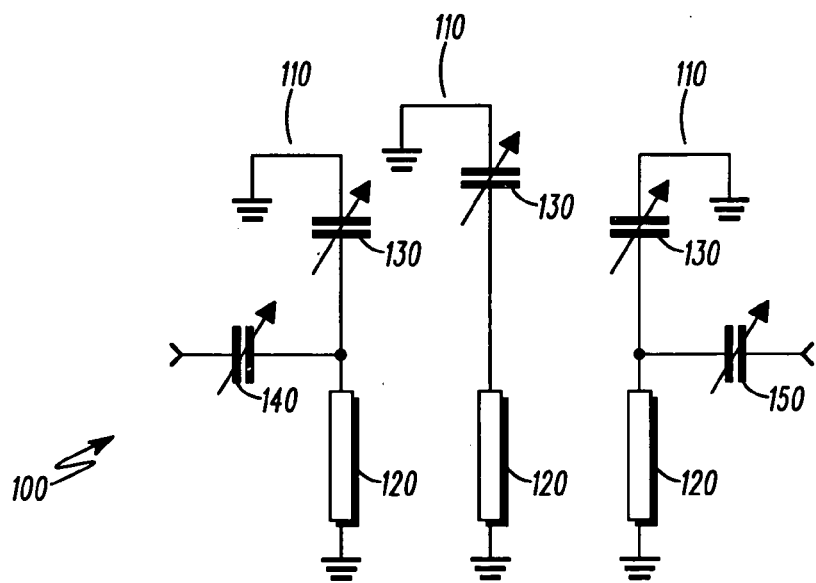
FIG. 3 is a schematic of a tunable filter of one embodiment of the present invention.

In one embodiment of the present invention, tunable filters 25 and 30 may include a combline structure 100, a three-resonator version of which is illustrated in FIG. 3. The filter structure 100 includes three coupled, transmission line reactive elements 120, which may, for example, be implemented in a multi-layered ceramic circuit. When paired with tunable reactive elements 130 the transmission line elements become resonators with a defined center frequency and quality factor. To maximize power transfer between the filter and the surrounding circuitry, impedance matching elements 140 and 150 are used. In alternate embodiments, capacitors 130, 140 and 150 may be varactors or Micro-Electro-Mechanical Systems (MEMS) variable capacitors. The combline structure 100 facilitates tunability because the coupling impedance between resonator lines 120 changes in a favorable manor for maintaining a nearly constant bandwidth as center frequency is tuned. The tuning elements within combline structure 100 may be optimized in advance for return loss and passband performance for the individual filters, and later duplexed using the phase shifters for optimal communication system performance. Varying the step-up capacitors 140 and 150 for changing antenna impedance may provide additional system improvements. In another embodiment of the present invention, transmission lines 120 at about fifty degrees (50°) at the center frequency provide minimum bandwidth variation.

Figure 4:
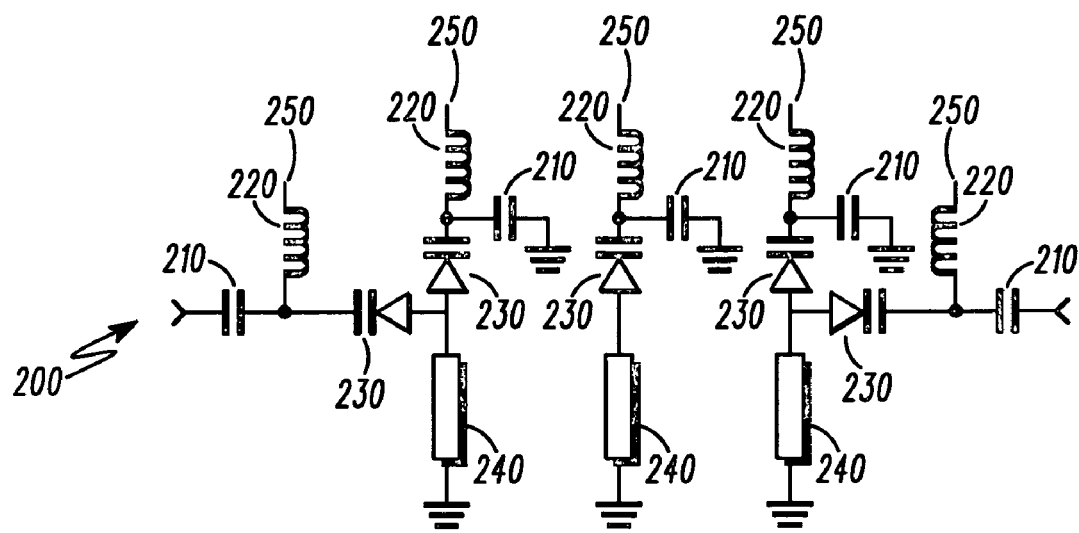
FIG. 4 is a schematic of another embodiment of a tunable filter in a tunable duplexer and in accordance with the present invention.

FIG. 4 illustrates another embodiment of a filter structure 200 having an alternative arrangement for bypassing tuning elements. Within filter structure 200, all capacitors 210 are bypass capacitors over the operating frequency. The inductors 220 may be RF chokes or high impedance lines over the frequency range, and the varactor diodes 230 are typically voltage variable capacitors or an equivalently functioning component. Transmission lines 240 are mutually coupled with the required characteristic impedance, coupling impedance and electrical length, with tuning voltages applied 250.

The filter structures 100 or 200 may be built on any multi-layered substrate, such as a circuit board or multi-layered ceramic, or as a three-dimensional (3D) object. For example, transmission lines 120 or 240 may be metal rods in a cavity, or they may be made as resonator pucks.

Figure 5:
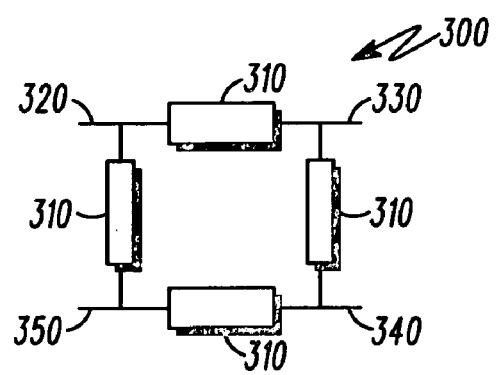
FIG. 5 is a block diagram of an embodiment of a variable phase shifter in a tunable duplexer and in accordance with the present invention.

In an embodiment of the present invention as shown FIG. 5, phase shifters 15 and 20, incorporate a circuit 300 composed of a quadrature hybrid coupler and variable reactances (such as variable capacitors individually or combined with other reactive components). In FIG. 5, a branchline coupler (or quadrature hybrid) 300 is shown having all transmission lines 310 of length λ/4 at the center frequency, with input 320, coupler outputs, 330 and 340, and isolation port, 350. For out$_1$ 330 terminated with a reflection coefficient $\Gamma_1$ and out$_2$ 340 terminated with reflection coefficient $\Gamma_2$, a signal applied to input 320 will pass through the coupler and reflect off the reactive terminations, which are bypassed with blocking capacitors and fed tuning voltage through RF chokes, travel back through the coupler and emerge at the isolation port. The reflections will arrive at the isolated port ($V_{isolated}$), 350 scaled according to the equation:

$$V_{isolated} = jV_i \cdot \left(\frac{\Gamma_1 + \Gamma_2}{2}\right)$$

Assuming a purely reactive termination, $\Gamma_1 = \Gamma_2 = e^{j\theta}$, then the signal that appears at the isolated port 350 is:

$$V_{isolated} = jV_i e^{j\theta} = V_i e^{j(\theta + \pi/2)}$$

The input signal will have been phase shifted by an angle $\theta + \pi/2$. The angle of the reflection coefficient can be found from the definition of the reflection coefficient, $\Gamma$, using the reactive termination impedance jX, where $\theta = \pi - 2\tan^{-1}(X/50)$, assuming a fifty (50) Ohm characteristic impedance:

$$\Gamma = \frac{jX - 50}{jX + 50} = \sqrt{\frac{X^2 + 50^2}{X^2 + 50^2}} \angle(\pi - 2\tan^{-1}(X/50)) = 1\angle\theta$$

Other quadrature couplers may be used for phase shifter (15 and 20) design, such as Lange couplers or broadside coupled lines, with all couplers amenable to multi-layer implementation.

It will be understood by those skilled in the art that additional designs for shifting the phase may be incorporated to match antenna impedance and isolate or manage Tx and Rx operations within the duplexer. By way of example and not limitation, a periodic loaded line, which includes transmission lines with periodically spaced variable shunt capacitors, may be utilized within the spirit of the invention. In this alternative, capacitors may be changed in accordance with the characteristic impedances of the transmission lines.

Figure 7:
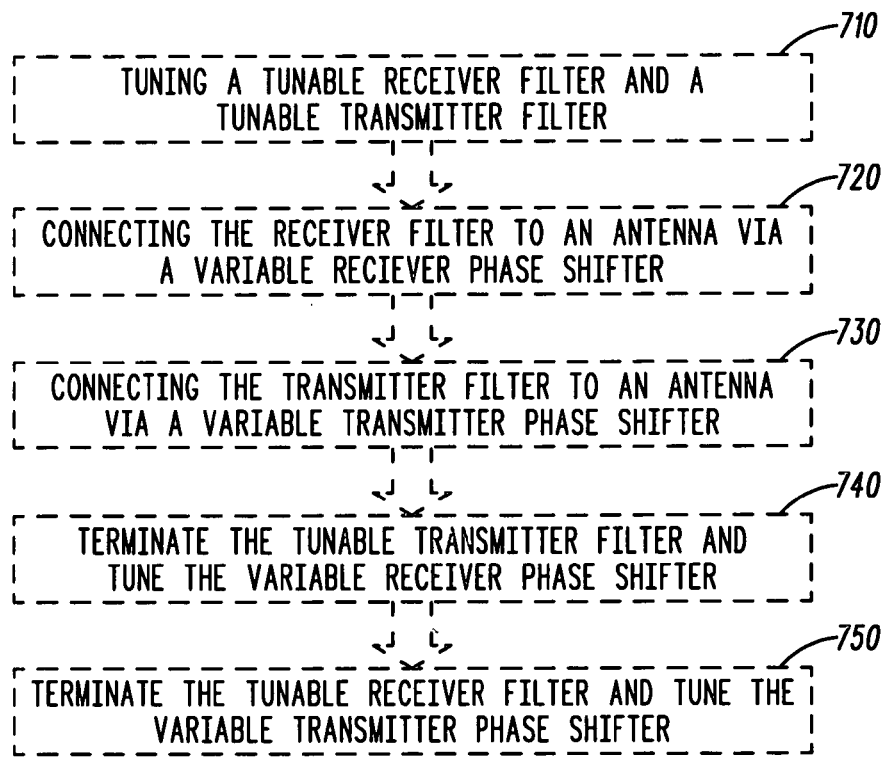
FIG. 7 is a block diagram of a method of calibrating a tunable duplexer.
Figure 8:
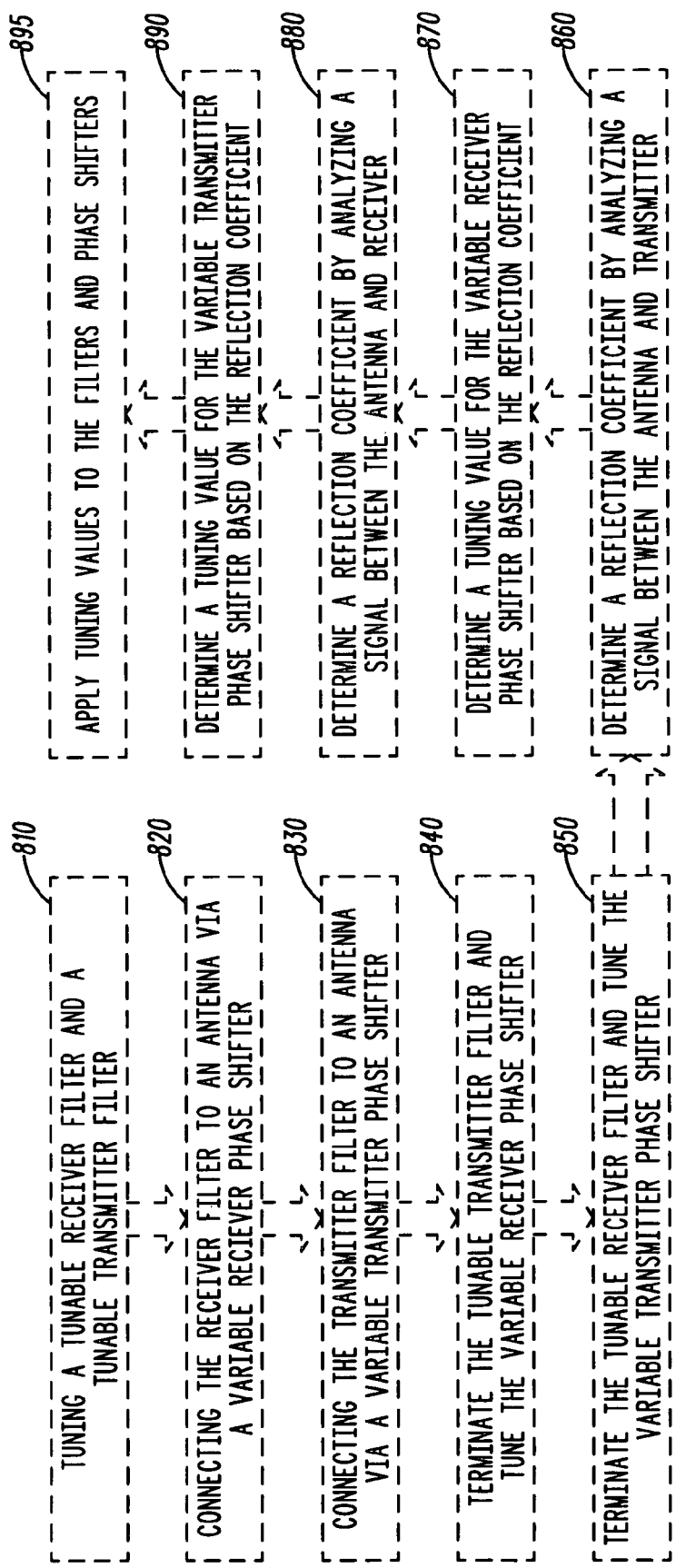
FIG. 8 is a block diagram of another method calibrating a tunable duplexer.

The present invention may be viewed as a method for using or calibrating the tunable duplexer for various frequencies of operation and temperature, as shown in FIGS. 7 and 8. One method for calibrating the tunable duplexer includes building up and optimizing the tunable filters individually (a Tx tunable filter, and an Rx tunable filter), by applying an initial tuning value to each filter based on design of the communication system, and then inserting them in a duplexer environment that consists of the phase shifters 15, 20 and the antenna port, as in block 710 and 810. The application of initial tuning values to the filters and their associated optimization may be performed using a two-port network analyzer and optimizer software that may contain optimization routines, which is commonly used within the art. Tuning values which optimize the filter performance in some subjective sense (e.g., return loss, Tx-Rx isolation, passband shape, or applying predetermined weightings to all) are determined for desired bands or frequencies of operations and recorded. Tuning values may include voltages, reflection coefficients, or other parameters associated with impedance matching and network analyzing. Iterations of optimization methods may be performed using random and/or gradient methods to generate tuning values. Each variable element may require multiple tuning values to cover a range of specific frequencies and temperatures. For the entire filter with a plurality of tuning elements, multiple tuning values would be generated per frequency and temperature. To operate at frequencies that are in-between optimized frequencies and temperatures, intermediate tuning values may be interpolated or calculated from curve fitting, if necessary.

The filters are then operably connected to the duplexer environment and tuned with the generated or recorded tuning values as in blocks 720, 730, 820, and 830. The duplexer environment may include, but is not limited to, a duplexer module including the antenna, the Rx componentry, the Tx componentry, Rx and Tx phase shifters, and D/A converters used to tune the variable reactance elements.

Upon tuning the tunable filters, the phase shifters are optimized. In one embodiment of the present invention, a two-port analyzer is used to analyze a signal between the antenna and the output of the Tx filter as in block 860, while terminating the Rx filter at a predetermined impedance (e.g., 50 ohms) as in blocks 740, 750, 840 and 850. The Rx phase shifter is optimized to minimize the impact on the transmitter filter, seeking the best Tx filter return loss over the frequency(s) of interest as in blocks 870, 880, and 890. Rx phase shifter tuning values may be recorded for these frequencies and temperatures or they may be applied later to the phase shifter as in block 895. Similarly, the two-port analyzer is used to analyze a signal between the antenna and the output of the Rx filter, while terminating the Tx filter at a predetermined impedance as in block 880. The Tx phase shifter is optimized to minimize the impact on the transmitter filter, seeking the best Rx filter return loss over the frequency(s) of interest as in block 890. The Tx phase shifter tuning values may be recorded for these frequencies and temperatures. Recorded values may be stored in any computer readable medium, capable of retrieval and re-use for various duplexer operations and calibrations. In one embodiment, recorded tuning values are read out and applied to D/A converters to adjust filters and phase shifters as in block 895. Recorded tuning values may be segmented into sets for phase shifters and tunable filters, into sets for Rx and Tx operations, or any other manageable method, as long as identification of the tuning values retain its associated frequency of operation and temperature. Since the reflection coefficient is determined at the time of the filter tuning and the reflection coefficient is used to determine phase shifter tuning, pairing of the filter and phase shifter tuning values is preferred. Additionally, phase shifter tuning values are paired with filter tuning values since matching and optimization of the two tuning values avoids detrimental impedance effects.

In a similar embodiment, the duplexer may be completely assembled and the filters and phase shifters may be tuned in-place starting with initial conditions of nominal tuning values (determined from design and updated with actual factory data) instead of first optimizing the filters and then subsequently the phase shifters. In this embodiment, the two-port network analyzer is connected between the Tx and Rx ports, and a 50 Ohm termination is placed on the antenna port, and the circuit is optimized for e.g., best return loss across the Tx and Rx passbands. For this optimization, all of the tuning values for the Tx and Rx filters plus the Tx and Rx phase shifters are optimization variables. This is typically a larger optimization problem (but still readily solvable by standard optimization routines) than the previously discussed embodiment that optimizes the filters individually first and then optimizes the phase shifters. Several advantages to this approach are that the duplexer can be completely assembled before calibration, and so any impedance interactions that might occur between the filter and the phase shifter can also be optimized out since the filter is tuned in the presence of its phase shifter. Generally, optimizations must be performed for the required operating frequencies and temperatures, and operation at intermediate values may be achieved by interpolating between calibration points.

In another alternate embodiment of the present invention that allows tuning of the duplexer with the filters in place, switches 12 and 14 of FIG. 2 are used to isolate the transmit and receive branches during the optimization. For this method, the Tx side switch 14 is opened (and switch 12 closed) and a network analyzer analyzes a signal between the antenna 10 and Rx node/ports 42. The tunable Rx filter 25 is then optimized for frequency and temperature, using a predetermined initial tuning values. Accordingly, the analyzer is used similarly to optimize the Tx filter after closing the Tx switch 14 and opening Rx switch 12. When the duplexer is being used for time duplex or time-and-frequency duplexing (i.e. no simultaneous transmit/receive), the tuning of the filter is complete. However, for full duplexing, both switches 12 and 14 are closed and the impedances of the two filters are allowed to interact, simulating the proper environment for operation. To minimize this interaction, phase shifters are optimized as previously discussed; analyzing and optimizing one filter while the other is terminated, seeking the best return loss for the terminated filter, then repeating for the opposite filter and Tx node 44.

In yet another embodiment of the invention, a method of use and calibration may be used to tune the transmitter and receiver filters to any frequency, provided the frequencies are not so close that the passbands adversely interact during full duplex operations. Such minimum spacing conditions may typically be on the order of one bandwidth separation, although the filter order and type may be determinative. If the communication system is not to be operated in a full duplex mode (i.e., simultaneous Tx/Rx), then the filters may overlap arbitrarily and a minimum frequency spacing is not required, since switch isolation keeps the filter impedances from detrimentally interacting.

In general, if some minimum spacing is enforced, arbitrary Tx/Rx spacing may be permitted. This mode provides greater flexibility for a range of predetermined combinations of frequencies, but requires more storage and calibration. For arbitrary spacing methods, the same aforementioned methods of filter tuning may be incorporated at a specific spacing pattern (e.g., every 100 MHz) instead of at the fixed, predetermined frequencies. Within this embodiment, optimization may be performed in filter pairings. For example, the Rx filter may be optimized at frequency 1 ($f_1$), paired with the Tx filter at frequency $f_2$. This would give filter and phase shifter tunings for the frequency combination ($f_1,f_2$). Then the Tx filter would be shifted to $f_3$, and the system would be re-optimized, giving the optimum filter and phase shifter tuning for frequency combination ($f_1,f_3$). Such a routine could be generated for an unlimited number of frequency pairings, creating numerous tuning values for use in changing duplexer conditions. Pairings in this embodiment of the invention would be random, as opposed to pre-defined pairings, discussed in earlier embodiments.

For arbitrary spacing and pairings, the use of new or different tuning values for the filters requires changing the phase shifter values; however, since reflection coefficients were previously determined in earlier calibrations, interpolation or calculations could be made to determine new phase shifter tuning values. For frequencies that lie between these pairings, interpolation would need to be performed. Depending on the spacing, a curve fit with order higher than linear may be required for the interpolator to follow the curvature of the tuning characteristics closely enough (depending on memory constraints, calibration costs, etc.). Interpolations or calculations may be performed for each potential pairing of filters for a calibration over N frequencies. For example, from 1500 to 2500 MHz or eleven (11) frequencies (assuming every 100 MHz with interpolation for resolution finer than 100 MHz), N(N−1) pairings (e.g., 110 pairings) would need to be calibrated per temperature.

Undefined antenna impedance could also be managed and controlled by the present invention. The term undefined generally indicates that impedance is not known at the time of manufacture or calibration (e.g., due to the presence of near-field reflection). Undefined operation requires some reflection coefficient determination to be performed in-situ or during operation of the communication system. Starting with the predefined tuning values, using, for example, a bi-directional coupler in both the transmitter and receiver so that a signal can be injected into the transmitter or receiver, the reflection can be measured (in some situations, transmission of a test signal may be objectionable in the receive band, such as injecting a test signal into the receive filter and out the antenna). Subsequently, an optimization routine to iteratively determine the best settings for the filter tuning and the phase shifter would then be performed.

Figure 6:
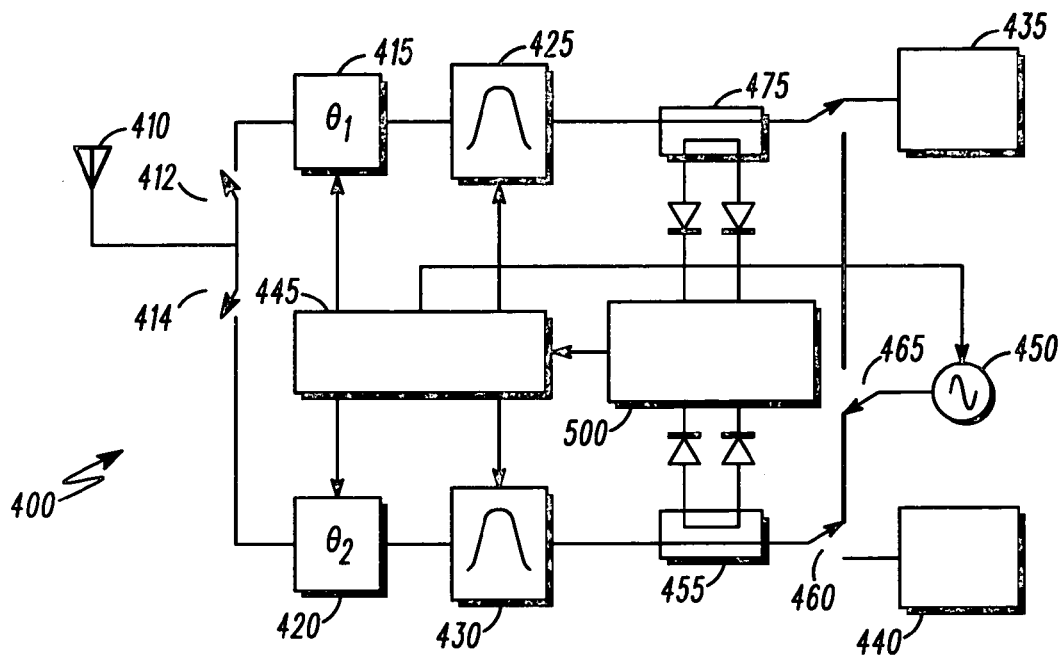
FIG. 6 is a block diagram of the tunable duplexer incorporating additional features and functions for changing antenna impedances and frequencies of operation.

FIG. 6 illustrates another embodiment of a duplexer, 400. As previously discussed, arbitrary spacing provides additional duplexer function and features; however, such a mode presumes an adequate antenna load. Duplexer system 400, includes, in addition to arbitrary spacing modes of operation, capabilities to compensate for antenna load degradation during operation of the communication system. Duplexer system 400 allows such capabilities by altering the filter tuning and phase shifter values in real time.

In accordance with the aforementioned tunable duplexer structures, (FIGS. 1 and 2) antenna 410, phase shifters, 415, 420, tunable filters, 425, 430, and receiver and transmitter componentry 435, 440 are operably and similarly configured. The calibration signal generator 450, reflection estimator 500, tuning control 445, dual directional couplers and detectors 455, 475, and switches 460, 465, 480, provide the additional circuitry for in-situ tuning of filters and shifters. Alternate, more complicated embodiments of this architecture may be provided within the spirit of the invention, where limited network analyzer functionality is incorporated into the communication system.

In one embodiment of the invention using the system illustrated in FIG. 6, the communication system contains an initial condition table for each frequency that is developed from a pre-defined or a pre-calibration setting. In operation, the invention functions, in one embodiment, by having the calibration signal generator 450 connected to the transmitter unit 440 through switch 460, while tunable Rx filter 425 is terminated via switch 480 in the LNA load 435. Calibration signal generator 450 may be selectively modified to a desired frequncy of operation, changing the capabilities of the communication device. By operably connecting the calibration signal generator 450 to the tunable Tx filter 430, the forward and reflected signal from the tunable Tx filter 430 is measured in detector 455. The ratio of the forward and reflected signal determines the quality of the impedance match with antenna 410 (i.e. a reflection parameter). For substantial differences in forward and reflected signal, only a small portion of the signal is reflected off of the filter 430, indicating a well matched circuit, requiring no further adjustments in the Tx circuitry. For neglible differences in the forward and reflected signals, a majority of the signal is reflected off of the filter 430, which translates into an improperly matched circuit. For such conditions, an optimizing tuning method similar to those previously discussed can be employed.

The reflection estimator 500 monitors the signal ratio and provides trend information related to optimization of the filters (425 and 430) and phase shifters (415 and 420) as adjustments are made with tuning values. In one embodiment, reflection estimator 500 may be composed of a series of A/D converters or comparators, sufficient to compare the reflected signal off of the filters. Tuning control 445 receives such information from the reflection estimator 500 and makes changes to the filters and phase shifters according to the tuning trend information and an opimitzation algorithm or routine.

Subsequent to optimizing one side of the duplexer, the calibration signal 450 is connected to the receiver filter 425 through switch 480 while filter 430 is terminated in the power amplifier (PA) load 440, and the forward and reflected power in the receiver filter can be measured with dual directional couplers and detectors 475. According to the optimization algorithm, the tuning for phase shifters (415 and 420) and filters (425 and 430) are altered with aid of the reflection estimator 500 and the tuning control unit 445. Forward and reflected signals are measured again with in the dual directional couplers and detectors 475 and 455 to determine which state is an improvement of the initial tuning. If the initial tuning is adequate for antenna impedance, then the bulk of the improvement will be gained in the tuning of the phase shifters 425 and 430

The aforementioned methods of calibration may also be explained in summarized notion using FIGS. 7 and 8, wherein the tuning of the filters are performed externally, then placed in a duplexer environment to determine tuning values for the phase shifters and tunable filter accordingly. The methods of the invention may be broadly viewed or categorized into one of two primary modes, a predefined mode and an adapt mode. In the predefined mode, controls that are sent to the tuning elements would be fixed at the time of manufacture (hence predefined), or whenever the calibration of the filter would be done to compensate the tuning over frequency and temperature. In adapt mode, the system would start with the predefined tuning state, and would then adjust the phase shifters and/or the tuning of the filter to compensate for unanticipated loading effects at the antenna or for different duplexer spacing than where accounted for during calibration.

It will be understood by those skilled in the art that the tunable duplexer system 5, (50 or 400) may also be implemented as interconnected machine logic circuits or circuit modules within a computing system. Additionally, the tunable duplexer may be implemented in a separate component of the communication system. The implementation is a matter of choice dependent on the performance and design requirements of the communication system. As such, it will be understood that the operations, structural devices, acts, and/or modules described herein may be implemented in software, in firmware, in special purpose digital logic, and/or any combination thereof without deviating from the spirit and scope of the present invention as recited within the claims attached hereto. Furthermore, the various methods, means for calibrating, software routines or software modules described herein may be implemented by any means as is known in the art. For example, any number of computer programming languages, such as "C", "C++", Pascal, FORTRAN, assembly language, Java, etc., may be used. Furthermore, various programming approaches such as procedural, object oriented or artificial intelligence techniques may be employed.

The tunable duplexer system 5 (50 or 400) may be stored in some form of computer readable media. As used herein, the term computer-readable media may be any available media that can be accessed by a processor or component that is executing the functions or steps of calibrating or using the tunable duplexer system 5 (50 or 400). By way of example, and not limitation, computer-readable media might comprise computer storage media and/or communication media.

A computer readable medium having computer-executable instructions may be used for performing the steps within the above method. The method for recording or computer storage media includes volatile and nonvolatile, removable and non-removable media implemented in any method or technology for storage of information such as computer readable instructions, data structures, program modules or other data. Computer storage media includes, but is not limited to, RAM, ROM, EPROM, flash memory or other memory technology, CD-ROM, digital versatile discs (DVD) or other optical storage, magnetic cassettes, magnetic tape, magnetic disc storage or other magnetic storage devices, or any other medium that can be used to store the desired information and that can be accessed by the computer or processor which is executing the operating code.

Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer-readable media. Computer-readable media may also be referred to as computer program product.

The invention claimed is:

1. In a communication system, a tunable duplexer comprising:
    a first variable phase shifter operably connected to an antenna and a receiver; and
    a second variable phase shifter operably connected to the antenna and a transmitter, wherein the system isolates the transmitter from the receiver and optimizes impedance matching with the antenna.

2. The communication system in claim 1, the duplexer further comprising:
    a transmitter node, a receiver node, and an antenna node;
    a first tunable filter operably connected to the first variable phase shifter and the receiver via the receiver node, the first variable phase shifter operably connected to the antenna via the antenna node; and
    a second tunable filter operably connected to the second phase shifter and the transmitter via the transmitter node, the second phase shifter operably connected to the antenna via the antenna node.

3. The communication system in claim 2, wherein the first tunable filter comprises a combline filter structure for maintaining a near-constant bandwidth, the structure including at least one resonator.

4. The communication system in claim 3, wherein the second tunable filter comprises a combline filter structure for maintaining a constant bandwidth, the structure including at least three resistors.

5. The communication system in claim 4, wherein the combline structures include a tunable capacitor and a transmission line.

6. The communication system in claim 3, wherein the first variable phase shifter comprises a quadrature hybrid coupler.

7. The communication system in claim 4, wherein the second variable phase shifter comprises a quadrature hybrid coupler.

8. The communication system in claim 6, wherein the first variable phase shifter further includes a variable reactive component.

9. The communication system in claim 7, wherein the second variable phase shifter further includes a variable reactive component.

10. The communication system in claim 6, further comprising:
    a first switch operably connected to the first variable phase shifter and the antenna; and
    a second switch operably connected to the second variable phase shifter and the antenna, wherein modes of operation of the duplexer includes receive only, transmit only, or full duplex, dependent of the state of the switches.

11. The communication system in claim 10, wherein the first and second switches comprise single pole, single throw switches.

12. The communication system in claim 10, further comprising:
a tuning control unit operably connected to the variable phase shifters and tunable filters, the tuning control unit operably connected to a calibration signal unit, wherein the phase shifters and tunable filters are altered by the tuning control to optimize duplexer operations;
the calibration signal generator further operably connected to the transmitter and the receiver, wherein the calibration signal generator provides multiple frequencies of operation; and
a reflection estimator operably connected to the tuning control unit and the calibration signal unit, the reflection estimator for monitoring and measuring forward and reflected signals within the duplexer.

13. The communication system in claim 12, further comprising:
a first dual directional coupler and a first detector operably connected to the first tunable filter, the reflection estimator, and the receiver, wherein the directional couplers and detector measure a receiver-based forward and reflected signals to determine improvement in duplexer operation; and
a second dual directional coupler and a second detector operably connected to the second tunable filter, the reflection estimator, and the transmitter, wherein the directional couplers and detector measure a transmitter-based forward and reflected signals to determine improvement in duplexer operation.

14. The communication system in claim 13, further comprising:
a third switch operably connected to the receiver, the first dual directional coupler, and the first detector;
a fourth switch operably connected to the transmitter, the second dual directional coupler, and the second detector; and
a fifth switch operably connected to the calibration signal unit, the transmitter, and the receiver.

15. The communication system in claim 14, further comprising:
a signal generated by the reflection estimator based on a ratio of forward and reflected signals within the duplexer; and
an optimization algorithm, wherein the tuning control unit adjusts the variable phase shifters and tunable filters according to an optimization algorithm and the reflection estimator signal.

16. The communication system in claim 15, wherein the third, fourth, and fifth switches comprise single pole, double throw switches.

17. A method of calibrating a tunable duplexer, the method comprising:
tuning a tunable receiver filter;
tuning a tunable transmitter filter;
operably connecting the tunable receiver filter to a receiver and an antenna via a variable receiver phase shifter;
operably connecting the tunable transmitter filter to a transmitter and the antenna via a variable transmitter phase shifter;
tuning the variable receiver phase shifter, while terminating the tunable transmitter filter; and
tuning the variable transmitter phase shifter, while terminating the tunable receiver filter.

18. The method in claim 17, wherein the tuning of the variable receiver phase shifter further comprises:
analyzing a signal between the antenna and the transmitter;
determining a reflection coefficient based on the terminated tunable transmitter filter; and
determining a tuning value for the variable receiver phase shifter based on the reflection coefficient.

19. The method in claim 18, wherein the tuning of the variable transmitter phase shifter further comprises:
analyzing a signal between the antenna and the receiver;
determining a reflection coefficient based on the terminated tunable receiver filter; and
determining a tuning value for the variable transmitter phase shifter based on a reflection coefficient.

20. A method of calibrating a tunable duplexer, the method comprising:
applying an initial tuning value to a tunable transmitter filter based on a pre-determined communication system design;
applying an initial tuning value to a tunable receiver filter based on the pre-determined communication system design;
determining at least one transmitter tuning value for the tunable transmitter filter based on a pre-determined frequency of operation and temperature;
determining at least one receiver tuning value for the tunable receiver filter based on the pre-determined frequency of operation and temperature;
tuning the tunable transmitter filter based on the transmitter tuning value; and
tuning the tunable receiver filter based on the receiver tuning value.

21. The method in claim 20, further comprising:
optimizing a receiver variable phase shifter for a transmitter signal in a duplexer environment, wherein the duplexer environment includes an antenna, a transmitter, a receiver, and the tuned filters, the optimizing based on the tuned transmitter filter; and
optimizing a transmitter variable phase shifter for a receiver signal in the duplexer environment, the optimizing based on the tuned receiver filter.

22. The method in claim 21, wherein optimizing the receiver phase shifter comprises:
analyzing a signal from the transmitter filter and the antenna; and
adjusting the receiver variable phase shifter to minimize the receiver's impact on the tuned transmitter filter.

23. The method in claim 22, wherein optimizing the transmitter phase shifter comprises:
analyzing a signal from the receiver filter and the antenna; and
adjusting the transmitter variable phase shifter to minimize the transmitter's impact on the tuned receiver filter.

24. The method in claim 23, further comprising:
repeating the steps of determining transmitter and receiver tuning values to generate a set of tuning values and to optimize the tunable filters; and
recording the set of tuning values.

25. The method in claim 24, further comprising:
determining an optimum receiver tuning value from the set of tuning values;

determining an optimum transmitter tuning value from the set of tuning values;

applying the optimum receiver tuning value to the tunable receiver filter; and applying the optimum transmitter tuning value to the tunable transmitter filter.

26. The method in claim 25, further comprises:

performing the steps of determining tuning values for the tunable filters within a duplexer module.

27. The method of claim 25, wherein determining tuning values comprises random methods of optimization.

28. The method of claim 25, wherein determining tuning values comprises gradient methods of optimization.

29. The method in claim 23, further comprising:

repeating the steps of determining transmitter tuning values for a first range of frequencies and temperatures to generate a set of transmitter tuning values and to optimize the tunable transmitter filter;

repeating the steps of determining receiver tuning values for a second range of frequencies and temperatures to generate a set of receiver tuning values and to optimize the tunable receiver filter; and recording the set of Transmitten and receiver tuning values.

30. The method in claim 29, further comprising:

determining an optimum receiver tuning value from the set of tuning values;

determining an optimum transmitter tuning value from the set of tuning values;

applying the optimum receiver tuning value to the tunable receiver filter; and applying the optimum transmitter tuning value to the tunable transmitter filter.

31. The method in claim 30, further comprising:

performing the steps of determining tuning values further the tunable filters within a duplexer module.

32. The method of claim 30, wherein determining tuning values comprises random methods of optimization.

33. The method of claim 30, wherein determining tuning values comprises gradient methods of optimization.

* * * * *